United States Patent [19]
Jones et al.

[11] Patent Number: 6,002,281
[45] Date of Patent: Dec. 14, 1999

[54] DELAY LOCKED LOOP

[75] Inventors: Matthew S. Jones, Chandler; Babak B. Nikjou; Morteza C. Afghahi, both of Tempe, all of Ariz.

[73] Assignee: Intel Corporation, Santa Clara, Calif.

[21] Appl. No.: 09/026,864

[22] Filed: Feb. 20, 1998

[51] Int. Cl.$^6$ ........................................... H03L 7/00
[52] U.S. Cl. ............................................ 327/161; 327/160
[58] Field of Search ...................... 327/264, 265, 327/271, 272, 273, 278, 279, 281, 285, 286, 288, 147, 149, 150, 151, 156, 158, 159, 160, 161; 375/373, 375, 376; 331/17, 25

[56] References Cited

U.S. PATENT DOCUMENTS

| | | | |
|---|---|---|---|
| 5,629,897 | 5/1997 | Iwamoto et al. | 365/195 |
| 5,684,421 | 11/1997 | Chapman et al. | 327/261 |
| 5,790,612 | 8/1998 | Chengson et al. | 375/373 |
| 5,815,016 | 9/1998 | Erickson | 327/158 |
| 5,831,465 | 11/1998 | Watarai | 327/281 |
| 5,854,797 | 12/1998 | Schwartz et al. | 371/22.1 |

*Primary Examiner*—My-Trang Nu Ton
*Attorney, Agent, or Firm*—Blakely, Sokoloff, Taylor & Zafman LLP

[57] ABSTRACT

An apparatus comprising a first circuit configured to receive a first clock signal and delaying the first clock signal by a first delay to generate a second clock signal, the first delay being a first function of a first signal; a phase-frequency detector configured to receive the first clock signal and the second clock signal and generate a second signal dependent on the first delay; a second circuit configured to receive tile second signal and generate a third signal, the third signal being a digital signal; and a current mirror configured to generate the first signal, the first signal being a second function of the third signal.

19 Claims, 6 Drawing Sheets

DELAY LOCKED LOOP

BACKGROUND OF THE INVENTION

1. Field of the Invention

The present invention relates to the field of generating a periodic signal-, more particularly, the present invention relates to a method and apparatus for generating a periodic signal using a delay locked loop.

2. Description of Related Art

Phase-locked loops (PLLs), synchronous delay lines (SDLs), and delay locked loops (DLLs) are used to generate an output clock signal that locks onto the period of an input clock signal.

These circuits use a charge pump that drives an analog control voltage to be received by sample and hold (S/H) circuits. The sampled analog control voltage is used to control a voltage-controlled oscillator (VCO) in a PLL and a voltage-controlled delay line in an SDL or DLL. Noise and mismatching between capacitors of the S/H circuits causes instability in the output clock signal (clock jitter). Clock jitter reduces the maximum frequency of operation of a device and may lead to device malfunction. In addition, charge pumps use large capacitors. The cost of a silicon device is related to the silicon area. Thus, these circuits may be relatively expensive to produce.

Lock time is the number of clock cycles required for the output clock signal to lock onto the period of the input clock signal. Since the device operation does not reliably begin until after a stable output clock is generated, the lock time is a component of the latency for the device to operate after power-up. SDLs, PLLs, and DLLs have lock times on the order of thousands of clock cycles. Thus, there is; a delay of thousands of clock cycles before the device begins to operate after power up. High latency leads to reduced performance. Furthermore, test procedures for a device during a manufacturing process typically include many power-up sequences. Thus, the latency increases the time to test the device and therefore increases manufacturing costs.

Similarly, if the period of the input clock signal is changed, there may be a latency of thousands of clocks for the output clock signal to lock onto the new period of the input clock signal. Thus, there is a delay of thousands of clock cycles before the device begins to operate after an operating frequency change. An operating frequency change may be performed, for example, to conserve power when the device is idle.

Furthermore, the use of analog circuitry in a digital device, such as a microprocessor, typically tends to make manufacturing more complex. Optimal manufacturing process conditions for analog circuitry is often different than that of digital circuitry. Compromises are often required. Thus, it is desirable to manufacture a purely digital device to permit the use of a manufacturing process that is optimized for digital circuitry without the additional complexity and, in some cases, reduced performance and/or yield due to the use of analog circuitry.

What is needed is a method and apparatus to reduce clock jitter in a device used to lock an output clock signal onto the period of an input clock signal. What is needed is a method and apparatus to reduce cost in a device used to lock an output clock signal onto the period of an input clock signal. What is needed is a method and apparatus to reduce the lock time in a device used to lock an output clock signal onto the period of an input clock signal. What is needed is a purely digital device to lock an output clock signal onto the period of an input clock signal.

SUMMARY OF THE INVENTION

An apparatus comprising a first circuit configured to receive a first clock signal and delaying the first clock signal by a first delay to generate a second clock signal, the first delay being a first function of a first signal; a phase-frequency, detector configured to receive the first clock signal and the second clock signal and generate a second signal dependent on the first delay; a second circuit configured to receive the second signal and generate a third signal, the third signal being a digital signal; and a current mirror configured to generate the first signal, the first signal being a second function of the third signal.

DETAILED DESCRIPTION

An embodiment of the present invention provides a method and apparatus to reduce clock jitter in a device used to lock an output clock signal onto the period of an input clock signal. Another embodiment of the present invention reduces cost in a device used to lock an output clock signal onto the period of an input clock signal. Yet another embodiment of the present invention provides a method and apparatus to reduce the lock time in a device used to lock an output clock signal onto the period of an input clock signal. One embodiment of the present invention provides a purely digital device to lock an output clock signal onto the period of an input clock signal.

In the following detailed description, numerous specific details are set forth in order to provide a thorough understanding of the described invention. Some of these specific details need not be used to practice the invention. In other instances, well-known structures, signals, and methods have not been shown in detail in order not to obscure the described invention.

Figure 1:
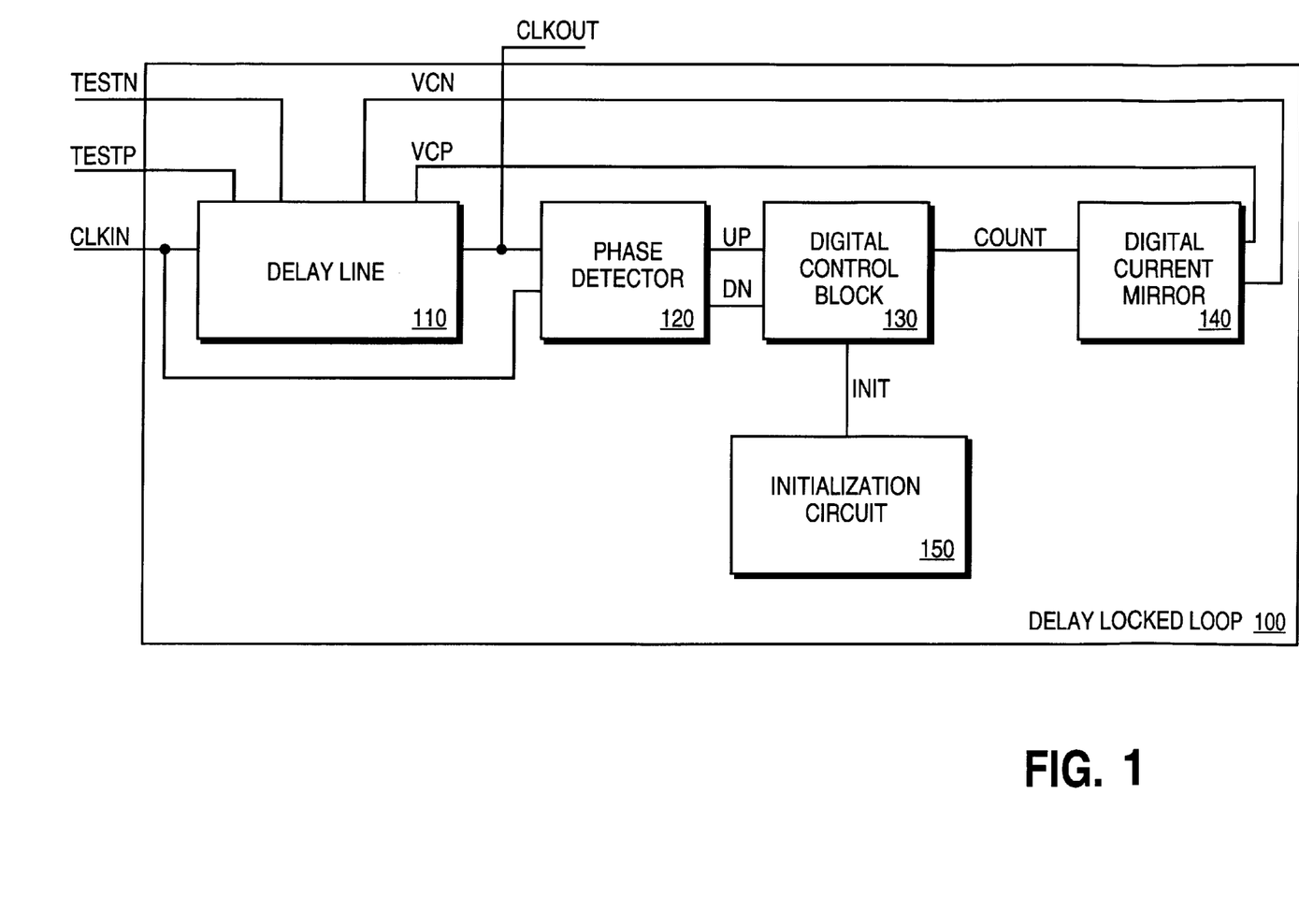
FIG. 1 illustrates one embodiment of a delay locked loop of the present invention.

FIG. 1 illustrates one embodiment of a delay locked loop of the present invention.

The delay locked loop 100 includes a delay line 110 a phase, detector 120, a digital control block 130, a digital current mirror 140, and an initialization circuit 150.

The delay line 110 is coupled to receive a clkin signal, a testn signal, a testp signal, a vcn signal, and a vcp signal, and configured to delay the clkin signal to produce the clkout signal. The clkin signal is typically an externally provided clock signal at a given period. The clkout signal is the clock signal that is locked onto the period of the clkin signal and distributed to the rest of the device (the logic portion of a microprocessor, for example). The vcn signal and the vcp signal are analog signal used to control how much the clkin signal is delayed to produce the clkout signal. In an alternate embodiment, a single signal is used to control the delay. The testn signal and the testp signal are used to adjust the range of delay of the delay circuit 100. Other signal configurations may be used to control the delay of the delay circuit 110. For example, a single signal is used to control the delay of the delay circuit 100.

A phase detector 120 is coupled to receive the clkin signal and the clkout signal and generate an up signal and a down signal. The up signal is asserted (a pulse) for the period that begins when the clkout signal is deasserted and ends when the clkin signal is deasserted. The down signal is asserted (a pulse) for the period that begins when the clkin signal is deasserted and ends when the clkout signal is deasserted. A pulse on the up signal indicates that a longer delay of the delay line 110 is requested. A pulse on the down signal indicates that a shorter delay of the delay line 110 is requested. In one embodiment, the phase detector 120 also generates a magnitude signal indicating the magnitude of the requested change in the delay of the delay line 110.

A digital control block 130 is coupled to receive the up signal and the down signal and generate a count signal. In one embodiment, the digital control block 130 includes an up-down counter that increments the value represented by the count signal in response to a pulse of the up signal and decrements the value represented by the count signal in response to a pulse of the down signal. Alternatively, the digital control block 130 receives the magnitude signal from the phase detector 120 and includes an arithmetic unit that that adds the magnitude to the value represented by the count signal in response to a pulse of the up signal and subtracts the magnitude from the value represented by the count signal in response to a pulse of the down signal.

A digital current mirror 140 is configured to generate the vcn signal and the vcp signal to control the delay of the delay line 110. The digital current mirror 140 includes a current source that drives two variable resistors that have resistances that depend on the value of the count signal. The voltage drop across one variable resistor is used to generate the vcn signal and the voltage drop across the other variable resistor is used to generate the vcp signal.

An initialization circuit 150 is used to generate an init signal. The init signal is received by the digital control block 130 to cause the value of the count signal to be set to a predetermined value. For example, the predetermined value may be set to the value of the count that corresponds to the target period of operation of th, device. Thus, the delay locked loop 100 requires less iterations to lock onto the period of the clkin signal. In one embodiment, the init signal is generated in response to the power up of the device. In another embodiment, the init signal is generated when the period of the clkin signal is changed. The initialization circuit 150 may be configured to generate the init signal under other conditions. Alternatively, the device has multiple target periods (each with a corresponding value of the count signal) and the init signal indicates a particular target period to be used. The value of the count signal is initialized to the value corresponding to the indicated target period.

Figure 2:
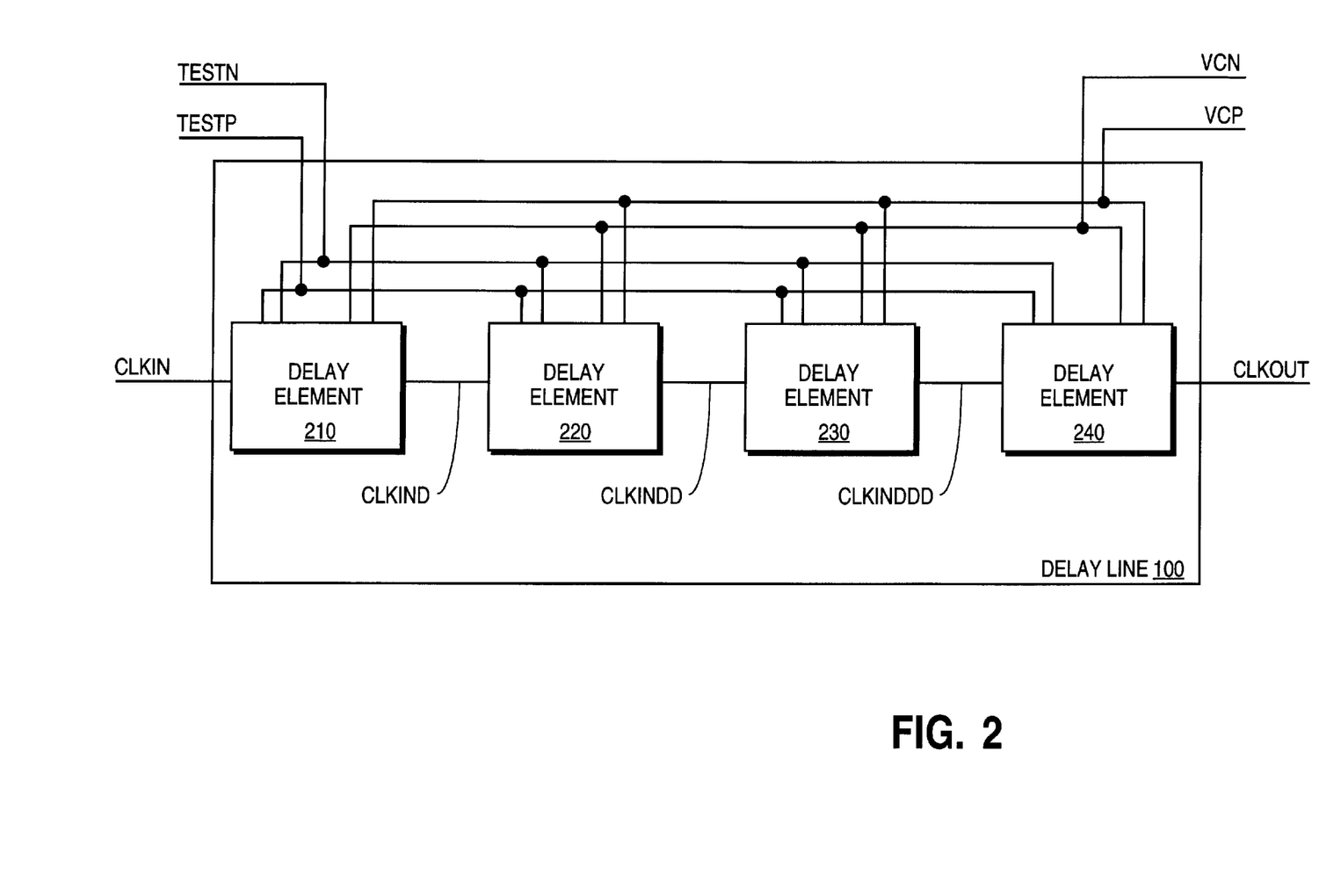
FIG. 2 illustrates one embodiment of a delay line of the present invention.

FIG. 2 illustrates one embodiment of a delay line of the present invention.

The delay line 200 includes a delay element 210, a delay element 220, a delay element 230, and a delay element 240. The delay element 210 is coupled to receive the clkin signal and generate a delayed clkin signal (clkind). The delay element 220 is coupled to receive the clkind signal and generate a delayed clkind signal (clkindd). The delay element 230 is coupled to receive the clkindd signal and generate a delayed clkindd signal (clkinddd). The delay element 240 is coupled to receive the clkinddd signal and generate the clkout signal. The delay element 210, the delay element 220, the delay element 230, and the delay element 240 are each coupled to receive the testn signal, the testp signal, the vcn signal, and the vcp signal to control the delay of each element. More or less delay elements may be used in the delay line 200. In addition, more or less control signals may be used to control the delay of th(e delay line 200.

Figure 3:
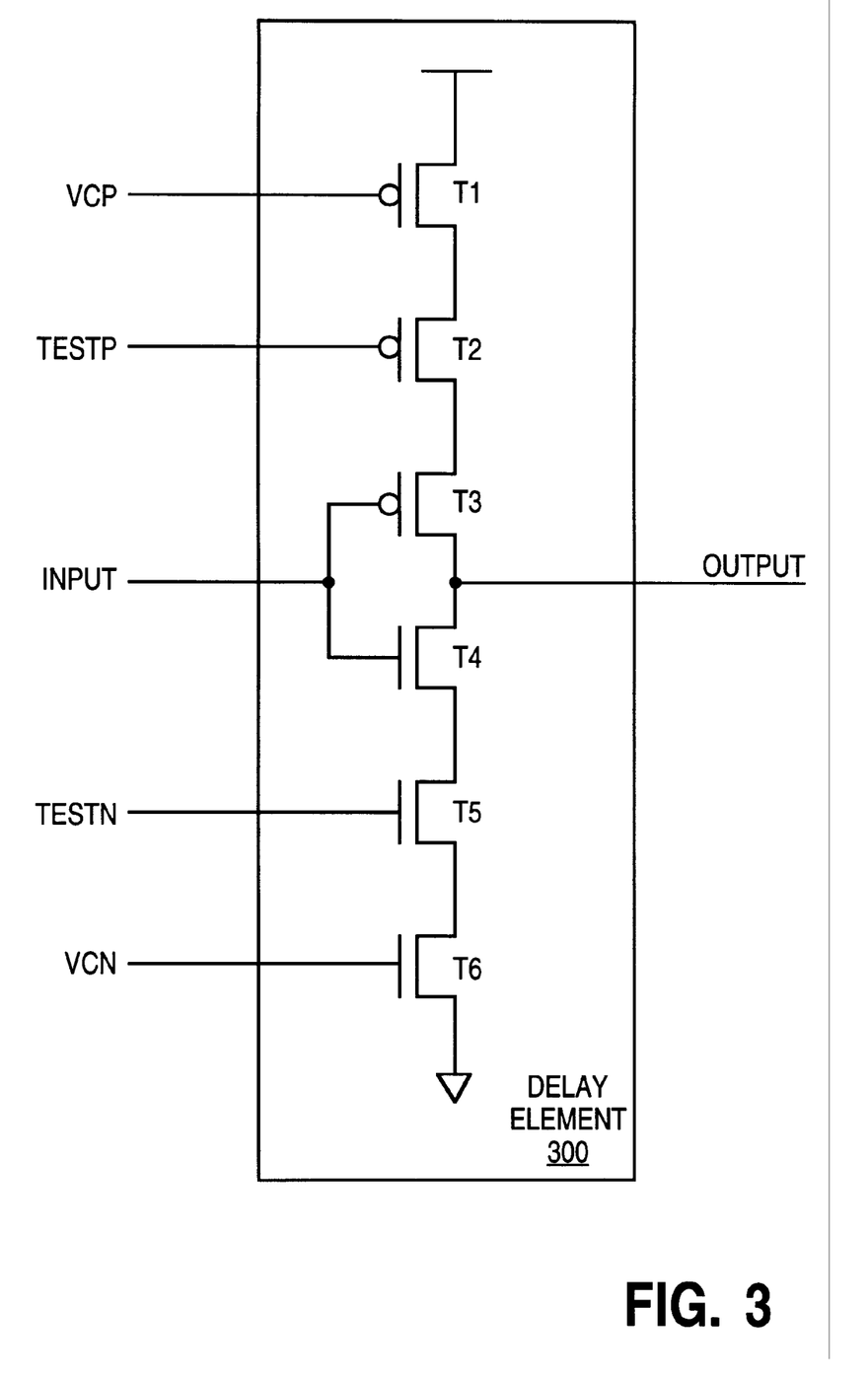
FIG. 3 illustrates one embodiment of a delay element of the present invention.

FIG. 3 illustrates one embodiment of a delay element of the present invention.

A delay element 300 is an inverter structure having three p—type transistors, a transistor T1, a transistor T2, and a transistor T3 in series and three n-type transistors, a transistor T4, a transistor T5, and a transistor T6 in series. The two series of transistors are coupled together to generate an output signal. An input signal is coupled to the gates of the transistor T3 and the transistor T4. The vcp signal is coupled to the gate of the transistor T1 and the vcn signal is coupled to the gate of the transistor T6. The testp signal is coupled to the gate of the transistor T2 and the testn signal is coupled to the gate of the transistor T5.

The testn signal and the testp signal are used to adjust the range of delay of the inverter by modifying the resistance of the corresponding series of transistors. The vcn signal and the vcp signal are used to adjust the delay within the range by modifying the resistance of the corresponding series of transistors. The inverter drives the output signal with an inverted and delayed input signal. In one embodiment, pairs of delay elements may be coupled in series to generate an output signal that is not a complemented version of the input signal.

Figure 4:
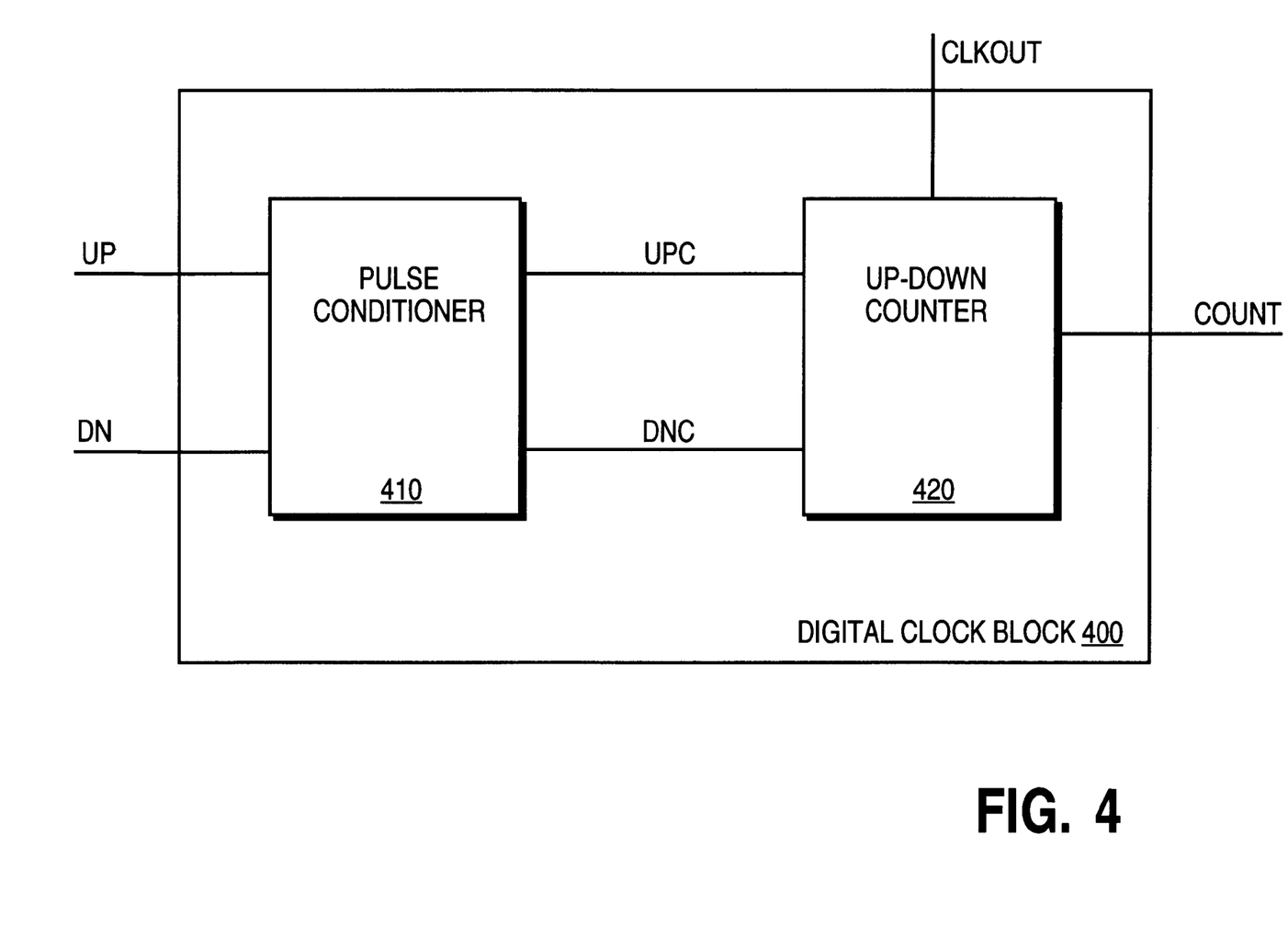
FIG. 4 illustrates one embodiment of a digital control block of the present invention.

FIG. 4 illustrates one embodiment of a digital control block of the present invention.

The up signal and the down (dn) signal are received from the phase detector to indicate the results of the comparison of the phase of the clkout signal relative to the clkin signal. In one embodiment, the pulses of the up signal and the dn signal are too narrow to be reliably sampled using a clock signal.

A digital control block 400 includes a pulse conditioner 410 and up-down counter 420. The pulse conditioner receives an up signal and a down (dn) signal and generates a conditioned up (upc) signal and a conditioned down (dnc) signal. The upc signal is asserted in response to a first pulse of the up signal and deasserted in response to a second pulse of the up signal. Similarly, the dnc signal is asserted in response to a first pulse of the dn signal and deasserted in response to a second pulse of the dn signal. The clkin and clkout signals of the phase detector are suppressed when an initialization signal is asserted. The initialization signal is also used to initialize the count signal.

The up-down counter 420 is used to generate the count signal. The count value is generated by using the previous count value. In one embodiment, the up-down counter 420 increments the value represented by the count signal if the upc signal is sampled high in response to the clkout signal and decrements the value represented by the count signal if the dnc signal is sampled high in response to the clkout signal. In another embodiment, the up-down counter 420 is an adder/subtractor and receives a magnitude signal and adds the magnitude to the value represented by the count signal if the upc signal is sampled high in response to the clkout signal and subtracts the magnitude from the value represented by the count signal if the dnc signal is sampled high in response to the clkout signal. Alternatively, the pulse conditioner 410 is not used and the up-down counter 420 performs its operations in response to the up signal and the dn signal.

Other configurations may be used to generate the count signal.

Figure 5:
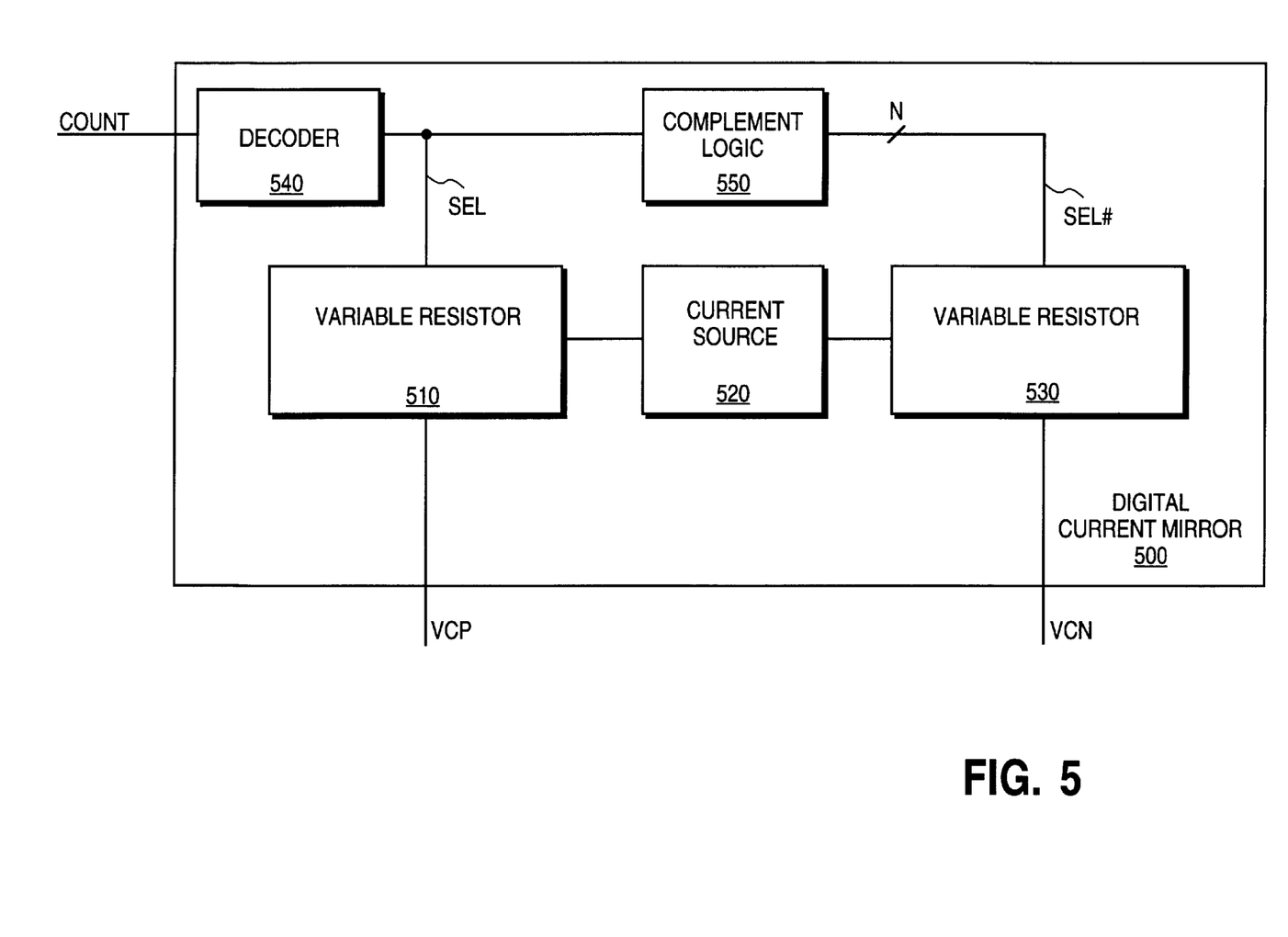
FIG. 5 illustrates one embodiment of a digital current mirror of the present invention.

FIG. 5 illustrates one embodiment of a digital current mirror of the present invention.

A digital current mirror 500 includes a current source 520 configured to drive a variable resistor 510 and a variable resistor 530. The count signal is received by a decoder 540 that is configured to generate a select (sel) signal. The sel signal is a decoded signal in which the number of bits asserted correspond to the value represented by the count signal. The set signal is received by a complement logic 550 that generates a sel# signal in which each bit is the complement of the corresponding bit of the sel signal. The variable resistor 510 is coupled to receive the sel signal to control its resistance and the variable resistor 530 is coupled to receive the sel# signal to control its resistance. The voltage across variable resistor 510 is used to generate the vcp signal and the voltage across variable resistor 530 is used to generate the vcn signal.

In one embodiment, the variable resistor 510 includes multiple n-channel transistors that are coupled in parallel. Each gate of the multiple n-channel transistors is coupled to a corresponding bit of the sel signal. In one embodiment, the variable resistor 510 includes 128 n-channel transistors in parallel and the count signal represents an 8-bit value. Each of the 128 gates is coupled to a corresponding one of a 128 bit sel signal such that the number of transistors enabled corresponds to the value of the count signal. For example, if the value of the count signal is 61, 61 of the 128 n-channel transistors are enabled. Thus, as the value of the count increases, more n-channel transistors are enabled, and the voltage across these transistors (the vcp signal) decreases. In one embodiment, the vcp signal is used to drive the gates of p-channel transistors of the inverter structure of the delay element 300. Thus, the increasing count reduces the delay in the delay element 300.

In one embodiment, the variable resistor 530 includes multiple p-channel transistors that are coupled in parallel. Each gate of the multiple p-channel transistors is coupled to a corresponding bit of the sel# signal. In one embodiment, the variable resistor 530 includes 128 p-channel transistors in parallel and the count signal represents an 8-bit value. Each of the 128 gates is coupled to a corresponding one of the 128 bit sel# signal such that the number of transistors enabled corresponds to the value of the count signal. Thus, as the value of the count increases, more p-channel transistors are enabled, and the closer the output voltage (the vcn signal) approaches that of the power supply voltage. In one embodiment, the vcn signal is used to drive the gates of n-channel transistors the inverter structure of the delay element 300. Thus, the increasing count reduces the delay in the delay element 300.

Note that one method of reducing sensitivity to process variations in the digital current mirror 500 is to lay the variable resistor 510 and the variable resistor 530 in a common centroid arrangement such that midpoints between all the pairs of transistors in each of the variable resistors are at the same location.

In one embodiment, the layout of the delay line 110 is such that the clkout signal is adjacent to the clkin signal and the phase detector 120 is placed such that the signal line length from the first clock signal to the phase detector 120 and the signal line length from the second clock signal to the phase detector 120 is matched. For example, the first 25 delay elements may be arranged in series such that the signal travels away from the input and the second 25 delay elements may be arranged in series such that the signal travels towards the input signal to generate an output signal adjacent to the input signal. The signal line length between each delay element is substantially identical. In the above example, the signal line between each of the first 25 delay elements and each of the second 25 delay elements is lengthened to be equal to the signal line length between the 25th delay element and the 26th delay element. Thus, differences in the signal timing attributable to mismatches in signal length is reduced.

In one embodiment, each delay element has a tap to provide a clock signal to the device that is earlier than the second clock signal. By arranging the delay line 110 such that the input is adjacent to the output, the distance from one tap to the next is equal to the distance from any other tap to the next. If the distance between any two consecutive taps is not equidistant then the delay between the clocks read at these two consecutive taps would not be consistent with the delay between clocks read at other pairs of consecutive taps. By arranging the taps so that consecutive taps are equidistant, clock jitter is reduced.

A layout as described herein can be used as a self-timed circuit in a device that uses a synchronous delay line (SDL), such as cache controllers, communications chips, ring oscillators, filters, and microprocessors.

Figure 6:
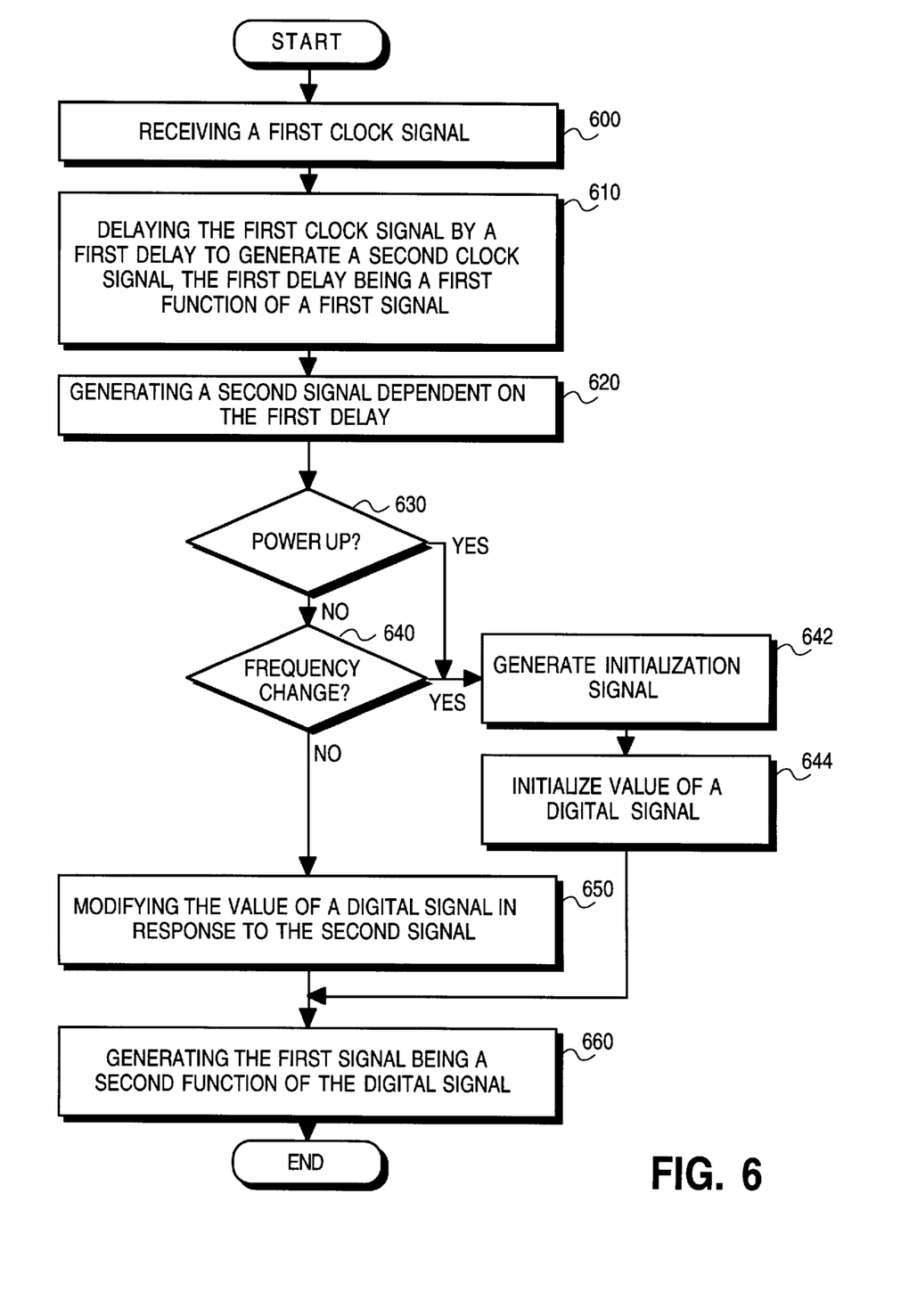
FIG. 6 illustrates one embodiment of the method of the present invention.

FIG. 6 illustrates one embodiment of the method of the present invention.

In step 600, a first clock signal is received.

In step 610, the first clock signal is delayed by a first delay to generate a second clock signal. The first delay is a function of a first signal.

In step 620, a second signal is generated based on the first delay. In one embodiment, the second signal is generated by a phase detector. A up signal and a down signal are generated depending on the phase delay of the first clock signal relative to the second clock signal.

In step 630, it is determined whether a power up operation is in progress. If yes, the method proceeds at step 642. If no, the method proceeds at step 650.

In step 640, it is determined whether a reset operation is in progress. If yes, the method proceeds at step 642. If no, the method proceeds at step 650.

In step, 642, an initialization signal is generated. The initialization signal is a request to initial the value of the digital signal. In one embodiment, the initialization signal also includes an indication of the period of operation. For example, the device may be designed to operate at multiple periods and the initialization signal specifies the current period of operation.

In step 644, a value of a digital signal is initialized to a first value. In one embodiment, the first value corresponds to the delay of the delay line that results in the second clock signal having the target period of operation. For example, if the device is designed to operate at a period of 15 nanoseconds, the first value is set to the value that corresponds to that period of operation. Alternatively, the first value is one of multiple values such that the selected value corresponds to the the delay of the delay line that results in the second clock signal having the target period of operation, and each of the multiple values corresponds to one of multiple periods.

In step 650, the value of the digital signal is modified in response to the second signal. In one embodiment, the value of the digital signal is incremented or decremented in response to the second signal. In another embodiment, a magnitude is added to or subtracted from the value of the digital signal in response to the second signal.

In step 660, the first signal is generated as a function of the digital signal. In one embodiment, the first signal includes one or more analog voltages that depend on the digital signal.

What is claimed is:

1. An apparatus comprising:
    a first circuit configured to receive a first clock signal and delaying the first clock signal by a first delay to generate a second clock signal, the first delay being a first function of a first signal;
    a phase-frequency detector configured to receive the first clock signal and the second clock signal and generate a second signal dependent on the first delay;
    a second circuit configured to receive the second signal and generate a third signal, the third signal being a digital signal; and
    a digital current mirror configured to generate the first signal, the first signal being a second function of the third signal.

2. The apparatus of claim 1 wherein the first circuit comprises a plurality of delay elements coupled in series, each of the plurality of delay elements having a second delay, the second delay being a third function of the first signal.

3. The apparatus of claim 2 wherein at least one of the plurality of delay elements has an input an an output, the delay element comprising an inverter having a plurality of p-type transistors coupled in series to the output and a plurality of n-type transistors coupled in series to the output, a first p-type transistor of the plurality of p-type transistors having a first gate coupled to the input and a second n-type transistor of the plurality of n-type transistors having a second gate coupled to the input, a third p-type transistor of the plurality of p-type transistors having a third gate coupled to receive a first voltage and a fourth n-type transistor of the plurality of n-type transistors having a fourth gate coupled to receive the second voltage, the first and second voltage being a function of the first signal.

4. The apparatus of claim 3 wherein a fifth p-type transistor of the plurality of p-type transistors having a fifth gate is coupled to receive a third voltage and a sixth n-type transistor of the plurality of n-type transistors having a sixth gate is coupled to receive a fourth voltage.

5. The apparatus of claim 1 wherein the second signal comprises a fifth signal and a sixth signal, wherein the phase-frequency detector is configured to generate the fifth signal and the sixth signal, the fifth signal being asserted when the first clock signal is asserted and the second clock signal is deasserted and the sixth signal being asserted when the first clock signal is deasserted and the second clock signal is asserted; and wherein the second circuit comprises a fourth circuit configured to receive the fifth signal and the sixth signal and generate a seventh signal and an eighth signal, the seventh signal being asserted in response to a first assertion of the first signal and deasserted in response to a second assertion of the first signal, the eighth signal being asserted in response to a third assertion of the second signal and deasserted in response to a fourth assertion of the second signal.

6. The apparatus of claim 2 wherein the second circuit comprises an arithmetic unit configured t o receive the second signal and generate the third signal, the third signal having a value, the arithmetic unit modifying the value in response to the second signal.

7. The apparatus of claim 6 wherein the arithmetic unit is an up-down counter.

8. The apparatus of claim 6 wherein arithmetic unit is configured to receive an initialization signal and initialize the value to a first value in response to the initialization signal.

9. The apparatus of claim 8 further comprising an initialization circuit configured to assert the initialization signal upon a power up operation.

10. The apparatus of claim 8 further comprising an initialization circuit configured to assert the initialization signal upon a reset operation.

11. The apparatus of claim 1 wherein the current mirror comprises a first variable resistor to generate a first voltage and a second variable resistor to generate a second voltage, and wherein the third signal has a value, the first variable resistor having a first resistance corresponding to the value and the second variable resistor having a second resistance corresponding to the value.

12. A method for generating a second clock signal comprising the steps of:
    receiving a first clock signal;
    delaying the first clock signal by a first delay to generate the second clock signal, the first delay being a first function of a first signal;
    generating a second signal dependent on the first delay;
    generating a third signal based on the second signal, the third signal being a digital signal; and
    generating the first signal, the first signal being a second function of the third signal.

13. The method of claim 12 further comprising the steps of:
    asserting a fifth signal when the first clock signal is asserted and the second clock signal is deasserted;
    asserting a sixth signal when the first clock signal is deasserted and the second clock signal is asserted;
    asserting a seventh signal in response to a first assertion of the first signal;
    deasserting the seventh signal in response to a second assertion of the first signal;
    asserting an eighth signal in response to a third assertion of the second signal; and
    deasserting the eighth signal in response to a fourth assertion of the second signal, wherein the second signal comprises the fifth signal and the sixth signal.

14. The method of claim 12 wherein the third signal has a value, the method further comprising the step of modifying the value in response to the second signal.

15. The method of claim 14 further comprising the step of incrementing the value in response to the second signal.

16. The method of claim 14 further comprising the step of decrementing the value in response to the second signal.

17. The method of claim 14 further comprising the step of:
    generating an initialization signal; and
    initializing the value to a first value in response to the initialization signal.

18. The method of claim 17 wherein the step of generating the initialization signal is performed during a power up operation.

19. The method of claim 17 wherein the step of generating the initialization signal is performed during a reset operation.

* * * * *